United States Patent
Yang

(10) Patent No.: US 12,165,876 B2
(45) Date of Patent: Dec. 10, 2024

(54) METHOD FOR FORMING ULTRA-SHALLOW JUNCTION

(71) Applicant: CHANGXIN MEMORY TECHNOLOGIES, INC., Hefei (CN)

(72) Inventor: Jian Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 487 days.

(21) Appl. No.: 17/454,246

(22) Filed: Nov. 9, 2021

(65) Prior Publication Data

US 2022/0254903 A1 Aug. 11, 2022

Related U.S. Application Data

(63) Continuation of application No. PCT/CN2021/111834, filed on Aug. 10, 2021.

(30) Foreign Application Priority Data

Feb. 7, 2021 (CN) .......................... 202110168061.9

(51) Int. Cl.
- *H01L 21/311* (2006.01)
- *H01L 21/02* (2006.01)
- *H01L 21/3115* (2006.01)
- *H01L 29/66* (2006.01)

(52) U.S. Cl.
CPC .. *H01L 21/31116* (2013.01); *H01L 21/02293* (2013.01); *H01L 21/31155* (2013.01); *H01L 29/66492* (2013.01)

(58) Field of Classification Search
None
See application file for complete search history.

(56) References Cited

U.S. PATENT DOCUMENTS

| | | | |
|---|---|---|---|
| 6,022,771 A | 2/2000 | Ma | |
| 6,342,422 B1 | 1/2002 | Wu | |
| 6,350,656 B1 | 2/2002 | Lin | |
| 6,815,770 B1* | 11/2004 | Chien | ................ H01L 29/7833 |
| | | | 257/E21.409 |
| 7,358,168 B2 | 4/2008 | Lin | |
| 2001/0010962 A1 | 8/2001 | Chen | |
| 2005/0255660 A1 | 11/2005 | Lin | |
| 2007/0023847 A1* | 2/2007 | Rhee | ................ H01L 29/6656 |
| | | | 257/E29.085 |

FOREIGN PATENT DOCUMENTS

| | | |
|---|---|---|
| CN | 1264166 A | 8/2000 |
| CN | 100463215 C | 2/2009 |
| CN | 102437028 A | 5/2012 |

(Continued)

OTHER PUBLICATIONS

First Office Action of the Chinese application No. 202110168061.9, issued on Jan. 30, 2022.

*Primary Examiner* — Feifei Yeung Lopez
(74) *Attorney, Agent, or Firm* — Syncoda LLC; Feng Ma

(57) ABSTRACT

A method for forming an ultra-shallow junction includes the following operations: providing a semiconductor substrate, forming an epitaxial layer on the semiconductor substrate, providing a dopant and implanting the dopant into the epitaxial layer and a part of the semiconductor substrate, and removing the epitaxial layer, to form the ultra-shallow junction.

11 Claims, 6 Drawing Sheets

(56) References Cited

FOREIGN PATENT DOCUMENTS

| | | |
|---|---|---|
| CN | 102468145 A | 5/2012 |
| CN | 103210481 A | 7/2013 |
| CN | 103426764 A | 12/2013 |
| CN | 103871814 A | 6/2014 |
| CN | 103972060 B | 4/2017 |
| CN | 108122758 A | 6/2018 |
| CN | 110896075 A | 3/2020 |
| CN | 112992684 A | 6/2021 |

\* cited by examiner

METHOD FOR FORMING ULTRA-SHALLOW JUNCTION

CROSS-REFERENCE TO RELATED APPLICATIONS

The present disclosure is a continuation of International Application No. PCT/CN2021/111834 filed on Aug. 10, 2021, which claims priority to Chinese Patent Application No. 202110168061.9 filed on Feb. 7, 2021. the disclosures of these applications are hereby incorporated by reference in their entirety.

BACKGROUND

With the development of technology, critical dimensions of semiconductor devices are getting smaller and smaller, and the thickness of the semiconductor device is getting smaller and smaller. Since the thickness of the semiconductor device becomes smaller, an ultra-shallow junction implantation process emerges. However, with the methods in the related technology, it is easy to achieve a high-energy and high-dose implantation, but it is hard to obtain a low-energy and low-dose implantation effect.

SUMMARY

The disclosure generally relates to the field of semiconductor techniques, and, in particular, to a method for forming an ultra-shallow junction.

In the embodiments of the disclosure, a method for forming an ultra-shallow junction includes the following operations:
providing a semiconductor substrate;
forming an epitaxial layer on the semiconductor substrate;
providing a dopant and implanting the dopant into the epitaxial layer and a part of the semiconductor substrate; and
removing the epitaxial layer, to form the ultra-shallow junction in the semiconductor substrate.

In the embodiments of the disclosure, a method for forming an ultra-shallow junction includes the following operations:
providing a semiconductor substrate;
forming an epitaxial layer on the semiconductor substrate;
forming a photoresist layer with a mask opening on the epitaxial layer, herein one part of the epitaxial layer is covered by the photoresist layer, the other part of the epitaxial layer is below the mask opening of the photoresist layer, and the epitaxial layer below the mask opening and a part of the semiconductor substrate form an implantation area;
providing a first dopant and implanting the first dopant into the implantation area, so that the first dopant is implanted into the epitaxial layer below the mask opening and the part of the semiconductor substrate;
removing the photoresist layer; and
removing the epitaxial layer to form the ultra-shallow junction in the semiconductor substrate.

BRIEF DESCRIPTION OF THE DRAWINGS

Through detailed description of example implementations of the disclosure with reference to accompanying drawings, its above and other features and advantages will be more apparent.

DETAILED DESCRIPTION

Figure 1:
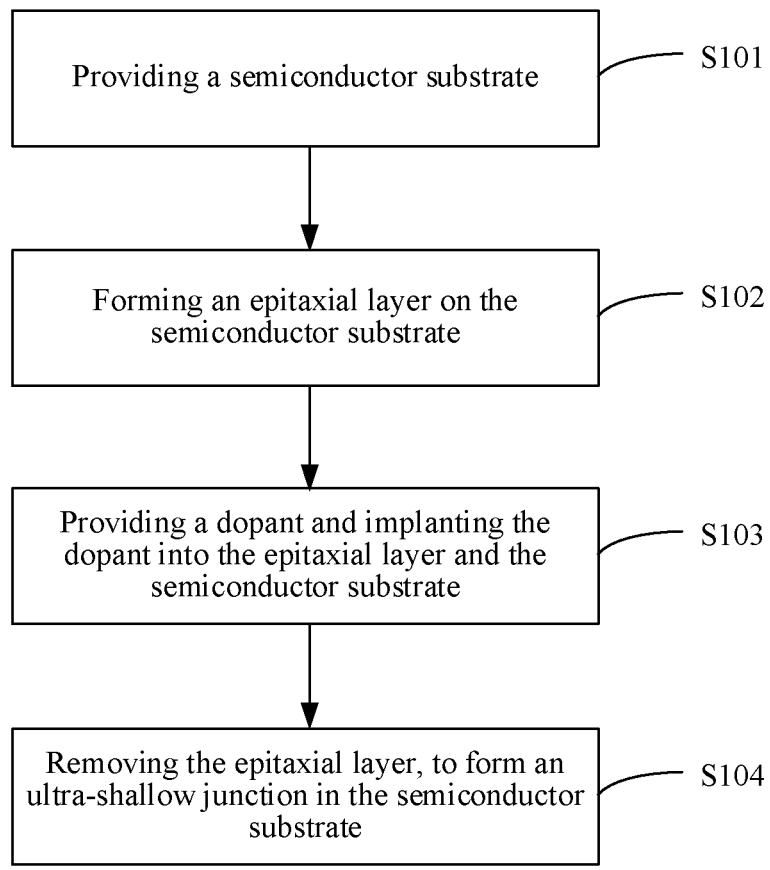
FIG. 1 illustrates a flowchart of a method for forming an ultra-shallow junction according to an embodiment of the disclosure.

Herein, example implementations will be described more comprehensively with reference to accompanying drawings. However, the example implementations may be implemented in various manners, and should not be construed as limited to implementations set forth herein. In contrast, provision of these implementations allows the disclosure to be comprehensive and complete, and a conception of the example implementations is comprehensively conveyed to those skilled in the art. Like reference numerals in the drawings indicate like or similar structures, and therefore their detailed description will be omitted.

Channel dimensions of a semiconductor device are getting smaller and smaller reducing, and while a horizontal channel dimension reduces, the thickness of the whole device is also continuously developing to a shallow layer. Due to miniaturization of the device, formation of an ultra-shallow junction implantation is necessary. In an existing ion implantation technology, the required energy is obtained by accelerating generated ions through an electric field. For a high-energy and high-dose ion beam, even in a case that beam attenuation exists during the transmission, a whole implantation may be achieved, so as to ensure a sufficient implantation uniformity. However, an ultra-shallow junction implantation requires an ultra-low energy (200 eV-3000 eV), a uniform implantation is hard to be achieved under a limitation of process conditions in relevant technology. For example, for formation of a source/drain, due to a large required dose ($5E14$ cm$^{-2}$-$8E15$ cm$^{-2}$), such a low-energy and high-dose implantation may be achieved in a scheme in a relevant technology. However, for a channel implantation or a Light Dopant Drain (LDD) implantation, such a low-energy and low-dose ($9E10$cm$^{-2}$-$5E12$cm$^{-2}$) implantation effect is hard to be achieved through the process in the related technology.

Based on this, an embodiment of the disclosure provides a method for forming an ultra-shallow junction. By improving processes, a low-energy and low-dose implantation effect may also be achieved using a high-energy and high-dose implantation, In combination with FIGS. 1 to 5 below, a method for forming an ultra-shallow junction according to an embodiment of the disclosure is explained in details. FIG. 1 illustrates a flowchart of the method for forming the ultra-shallow junction according to the embodiment of the disclosure. FIGS. 2 to 5 illustrate cross-sectional diagrams of different process phases of the method for forming the ultra-shallow junction according to the embodiment of the disclosure.

As shown in FIG. 1, a method for forming an ultra-shallow junction according to an embodiment of the disclosure includes the following operations. A semiconductor substrate is provided. An epitaxial layer is formed on the semiconductor substrate. A dopant is provided and the dopant is implanted into the epitaxial layer and a part of the semiconductor substrate. The epitaxial layer is removed, to form the ultra-shallow junction in the semiconductor substrate.

Figure 2:
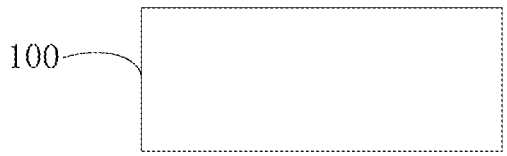
FIG. 2 illustrates a first cross-sectional diagram of a process phase in a method for forming an ultra-shallow junction according to an embodiment of the disclosure.

As shown in FIGS. 1 and 2, at S101, a semiconductor substrate 100 is provided.

In an embodiment, the semiconductor substrate 100 may contain a semiconductor material such as matrix silicon or monocrystalline silicon. In other embodiments or additional embodiments, the semiconductor substrate 100 may contain another semiconductor element such as germanium in a crystalline structure. The semiconductor substrate 100 may also contain semiconductor compounds such as silicon-germanium, silicon carbide, gallium arsenide, gallium phosphide, indium phosphide, indium arsenide, indium antimonide or a combination of the foregoing. The semiconductor substrate 100 may also include a semiconductor substrate on an insulation layer such as a silicon base on an insulation layer, a silicon-germanium base on an insulation layer or a germanium base on an insulation layer.

In some embodiments, the semiconductor substrate 100 is a bulk semiconductor substrate, such as a semiconductor wafer. For example, the semiconductor substrate 100 includes a semiconductor material containing silicon or other elements, such as germanium. The semiconductor substrate 100 may be doped (such as, p-type, n-type or a combination of the foregoing) or not doped. In some embodiments, the semiconductor substrate 100 includes a semiconductor layer epitaxially grown on a dielectric layer. The epitaxially grown semiconductor layer may be made of silicon-germanium, silicon, germanium, one or more other suitable materials or any combination of the foregoing.

In some other embodiments, the semiconductor substrate 100 contains a compound semiconductor. For example, the compound semiconductor includes one or more group III-V compound semiconductors, and has a composition defined in a formula $Al_{X1}Ga_{X2}In_{X3}As_{Y1}P_{Y2}N_{Y3}Sb_{Y4}$, where X1, X2, X3, Y1, Y2, Y3 and Y4 represent a relative ratio. Each of them is equal to or more than 0, and a sum of them is equal to 1. The compound semiconductor may include silicon carbide, gallium arsenide, indium arsenide, indium phosphide, one or more other suitable compound semiconductors or any combination of the foregoing. Other suitable bases including group II-VI compound semiconductors may also be used.

In some embodiments, the semiconductor substrate 100 is an active layer of a Semiconductor-on-Insulator (SOI) base. Fabrication of a semiconductor-on-insulator substrate may use a Separation by Implantation of Oxygen (SIMOX) process, a wafer bonding process, other suitable processes or any combination of the foregoing. In some other embodiments, the semiconductor substrate 100 includes a plurality of layers of structures. For example, the semiconductor substrate 100 includes a silicon-germanium layer formed on a bulk silicon layer.

Figure 3:
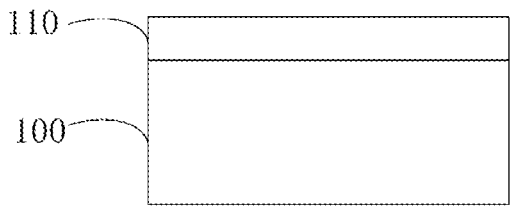
FIG. 3 illustrates a second cross-sectional diagram of a process phase in a method for forming an ultra-shallow junction according to an embodiment of the disclosure.

As shown in FIGS. 1 and 3, at S102, an epitaxial layer 110 is formed on the semiconductor substrate 100.

Although it is not shown in the drawings, it may be understood that before the epitaxial layer 110 is grown on the semiconductor substrate 100, an original silicon oxide layer on the semiconductor substrate 100 is generally removed through Hydrofluoric Acid (HF) etching at first.

It may be understood that the thickness of the epitaxial layer 110 formed on the semiconductor substrate 100 may be adjusted according to a junction depth of an ultra-shallow junction 120 to be subsequently formed on the semiconductor substrate 100. For example, when a thin junction depth is required to be formed on the semiconductor substrate 100, a thick epitaxial layer 110 may be grown on the semiconductor substrate 100. When a thick junction depth is required to be formed on the semiconductor substrate 100, a thin epitaxial layer 110 may be grown on the semiconductor substrate 100.

In an implementation, the epitaxial layer 110 is made of the same material as the semiconductor substrate 100. For example, the epitaxial layer 110 and the semiconductor substrate 100 are both made of silicon. Since the epitaxially grown silicon matches well with the silicon of the semiconductor substrate 100, the crystalline phase of the silicon of the epitaxial layer 110 is consistent with that of the silicon of the semiconductor substrate 100, and there are few impurities, an implantation effect will not be affected in a subsequent dopant implantation process. In contrast, if the material of the epitaxial layer 110 matches poorly with that of the semiconductor substrate, and the crystalline phase of the silicon of the epitaxial layer 110 is inconsistent with that of the silicon of the semiconductor substrate 100, doped ions will be trapped in a vacancy in a surface layer membrane of the epitaxial layer 110 during an implantation process, finally causing angular contamination of the implantation.

Figure 4:
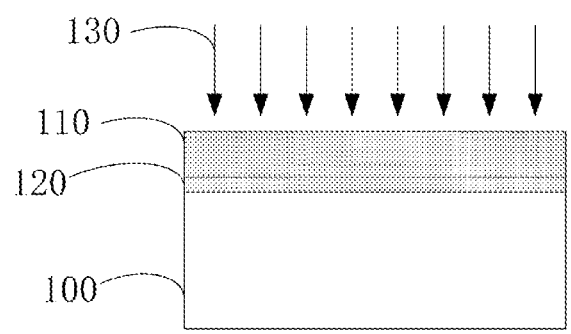
FIG. 4 illustrates a third cross-sectional diagram of a process phase in a method for forming an ultra-shallow junction according to an embodiment of the disclosure.

As shown in FIGS. 1 and 4, at S103, a dopant 130 is provided, and the dopant 130 is implanted into the epitaxial layer 110 and a part of the semiconductor substrate 100. The dopant 130 is in the epitaxial layer 110 and the part of the semiconductor substrate 100.

In an implementation, the dopant 130 may include but not limited to boron, aluminum, gallium, indium, thallium, nitrogen, phosphorus, arsenic, antimony and bismuth.

In some implementations, for the operation of implanting the dopant 130 into the epitaxial layer 110 and the part of the semiconductor substrate 100, the dopant 130 may be implanted by using an ion implantation process. In an implementation, the energy of the ion implantation process is more than 2 keV, and the dose of the ion implantation process is equal to or more than 1E13 cm$^{-2}$. The energy of the ion implantation process may be more than 5 keV, 8 keV, 10 keV, 12 keV, 14 keV, 16 keV, 18 keV, 20 keV and the like, and the dose of the ion implantation process may be 2E13 cm$^{-2}$, 5E13 cm$^{-2}$, 8E13 cm$^{-2}$, 1E14 cm$^{-2}$, 1E15 cm$^{-2}$, 5E15 cm$^{-2}$, 8E15 cm$^{-2}$ and the like.

In an implementation, the dose of the dopant 130 implanted into the part of the semiconductor substrate 100 is less than 1E13 cm$^{-2}$, for example, 9E10 cm$^{-2}$, 1E11 cm$^{-2}$, 1E12 cm$^{-2}$, 2E12 cm$^{-2}$ or 5E12cm$^{-2}$.

With the method for forming the ultra-shallow junction according to the embodiment of the disclosure, a low-energy (for example, 300 eV) and low-dose (for example, 2E12 cm$^{-2}$) implantation effect can be achieved by using a high-energy (such as, 10 keV) and high-dose (such as, 2E13 cm$^{-2}$) implantation condition.

Figure 5:
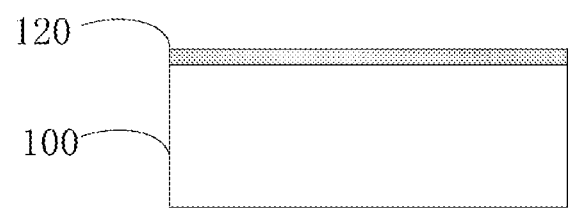
FIG. 5 illustrates a fourth cross-sectional diagram of a process phase in a method for forming an ultra-shallow junction according to an embodiment of the disclosure.

As shown in FIGS. 1 and 5, at S104, the epitaxial layer 110 is removed, to form an ultra-shallow junction 120 in the part of the semiconductor substrate 100.

In an implementation, the epitaxial layer 110 may be removed by using a dry or wet etching, or by using for example, a chemical-mechanical lapping process, a grinding process, a dry lapping process, a wet washing, one or more other suitable processes or any combination of the foregoing.

Although it is not shown in the drawings, it may be understood that after the epitaxial layer 110 is removed, a thermal treatment operation is also included. The thermal treatment includes but not limited to low-temperature thermal annealing, rapid thermal annealing, instantaneous annealing, peak annealing or laser annealing.

Figure 14:
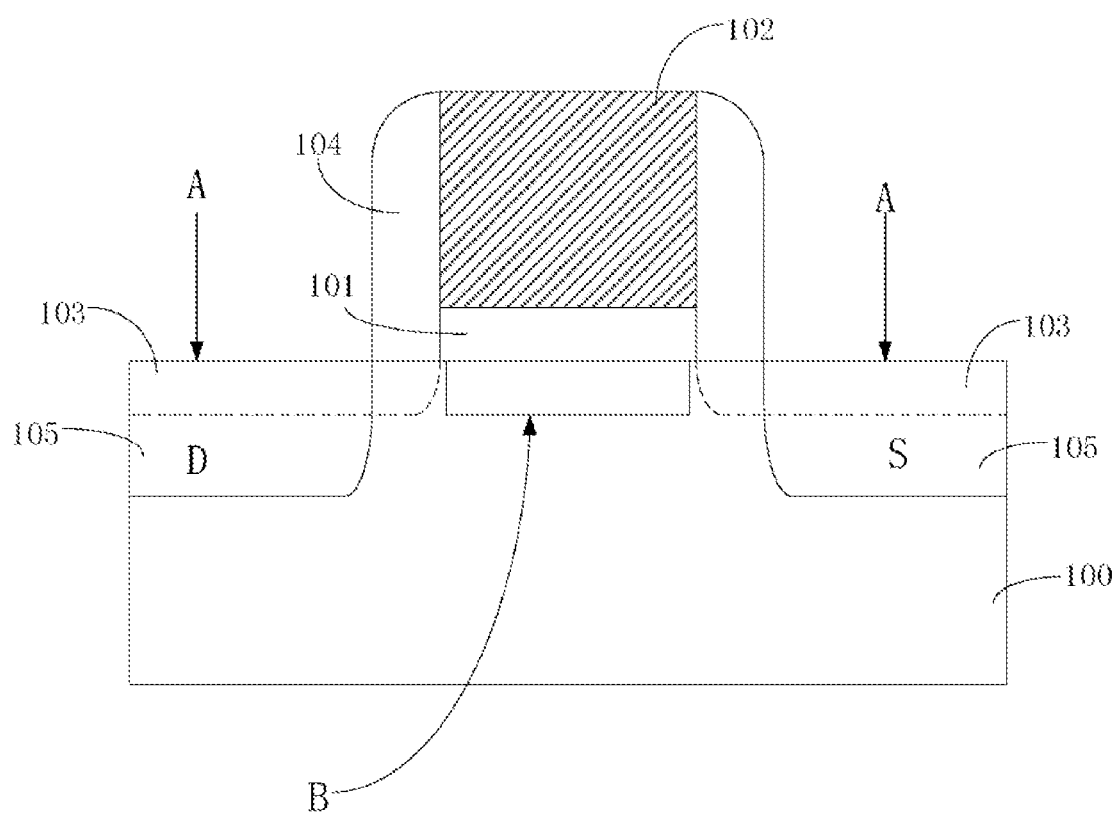
FIG. 14 illustrates a schematic diagram of a semiconductor transistor of an embodiment of the disclosure.

It may be understood that the method for forming the ultra-shallow junction according to the embodiment of the disclosure may be applied in a threshold voltage ion implantation area or a light doped structure implantation area near a source/drain of a device as shown in FIG. 14. A semiconductor transistor shown in FIG. 14 includes a semiconductor substrate 100, a gate oxide layer 101 formed on the semiconductor substrate, a gate structure 102 formed on the gate oxide layer 101, a separation side wall 104 formed on side walls of the gate oxide layer 101 and the gate structure 102, as well as a doped structure 103 and a source-drain structure 105. An area A in FIG. 14 is an implantation area of a light doped structure, and configured to increase a threshold voltage of the device and effectively control a short-channel effect of the device, and an area B is a threshold voltage ion implantation area, and configured to adjust the threshold voltage.

Figure 6:
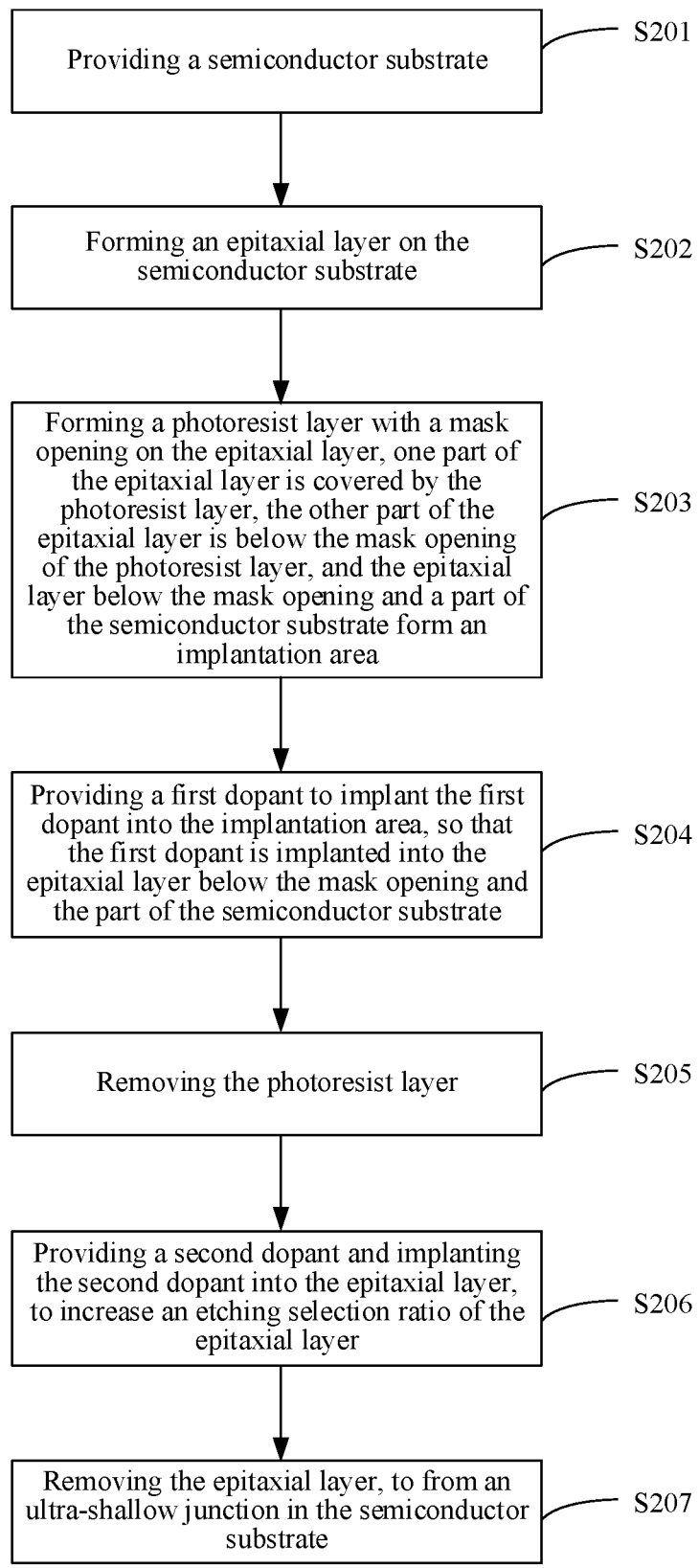
FIG. 6 illustrates a flowchart of a method for forming an ultra-shallow junction according to another embodiment of the disclosure.

In combination with FIGS. 6 to 13 below, a method for forming an ultra-shallow junction according to another embodiment of the disclosure is explained in details. FIG. 6 illustrates a flowchart of the method for forming the ultra-shallow junction according to another embodiment of the disclosure, and FIGS. 7 to 13 illustrate cross-sectional diagrams of different process phases of the method for forming the ultra-shallow junction according to another embodiment of the disclosure.

As shown in FIG. 6, the method for forming the ultra-shallow junction according to another embodiment of the disclosure includes the following operations. A semiconductor substrate is provided. An epitaxial layer is formed on the semiconductor substrate. A photoresist layer with a mask opening is formed on the epitaxial layer, one part of the epitaxial layer is covered by the photoresist layer, the other part of the epitaxial layer is below the mask opening of the photoresist layer, and the epitaxial layer below the mask opening and a part of the semiconductor substrate form an implantation area. A first dopant is provided, and the first dopant is implanted into the implantation area, so that the first dopant is implanted into the epitaxial layer below the mask opening and the part of the semiconductor substrate. The photoresist layer is removed. A second dopant is provided, and the second dopant is implanted into the epitaxial layer, to increase an etching selection ratio of the epitaxial layer. The epitaxial layer is removed, to form the ultra-shallow junction in the semiconductor substrate.

Figure 7:
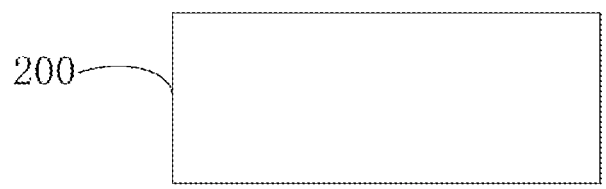
FIG. 7 illustrates a first cross-sectional diagram of a process phase in a method for forming an ultra-shallow junction according to another embodiment of the disclosure.

As shown in FIGS. 6 and 7, at S201, a semiconductor substrate 200 is provided.

In an embodiment, the semiconductor substrate 200 may contain a semiconductor material such as matrix silicon or monocrystalline silicon. In other embodiments or additional embodiments, the semiconductor substrate 200 may contain another semiconductor element such as germanium in a crystalline structure. The semiconductor substrate 200 may also contain semiconductor compounds such as silicon-germanium, silicon carbide, gallium arsenide, gallium phosphide, indium phosphide, indium arsenide, indium antimonide or any combination of the foregoing. The semiconductor substrate 200 may also include a semiconductor substrate 200 on an insulation layer such as a silicon base on an insulation layer, a silicon-germanium base on an insulation layer or a germanium base on an insulation layer.

In some embodiments, the semiconductor substrate 200 is a bulk semiconductor substrate, for example, a semiconductor wafer. For example, the semiconductor substrate 200 includes a semiconductor material containing silicon or other elements, such as, germanium. The semiconductor substrate 200 may be doped (such as, p-type, n-type or a combination of the foregoing) or not doped. In some embodiments, the semiconductor substrate 200 includes a semiconductor layer epitaxially grown on a dielectric layer. The epitaxially grown semiconductor layer may be made of silicon-germanium, silicon, germanium, one or more other suitable materials or any combination of the foregoing.

In some other embodiments, the semiconductor substrate 200 contains a compound semiconductor. For example, the compound semiconductor includes one or more group III-V compound semiconductors, and has a composition defined in a formula $Al_{X1}Ga_{X2}In_{X3}As_{Y1}P_{Y2}N_{Y3}Sb_{Y4}$, where X1, X2, X3, Y1, Y2, Y3 and Y4 represent a relative ratio. Each of them is equal to or more than 0, and a sum of them is equal to 1. The compound semiconductor may include silicon carbide, gallium arsenide, indium arsenide, indium phosphide, one or more other suitable compound semiconductors or any combination of the foregoing. Other suitable bases including group II-VI compound semiconductors may also be used.

In some embodiments, the semiconductor substrate 200 is an active layer of a Semiconductor-on-Insulator (SOI) base. Fabrication of a semiconductor-on-insulator substrate 200 may use a Separation by Implantation of Oxygen (SIMOX) process, a wafer bonding process, other suitable processes or any combination of the foregoing. In some other embodiments, the semiconductor substrate 200 includes a plurality of layers of structures. For example, the semiconductor substrate 200 includes a silicon-germanium layer formed on a bulk silicon layer.

Figure 8:
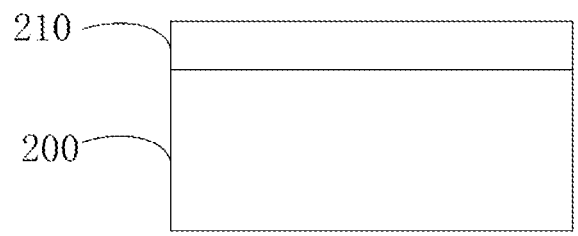
FIG. 8 illustrates a second cross-sectional diagram of a process phase in a method for forming an ultra-shallow junction according to another embodiment of the disclosure.

As shown in FIGS. 6 and 8, at S202, an epitaxial layer 210 is formed on the semiconductor substrate 200.

Although it is not shown in the drawings, it may be understood that before the epitaxial layer 210 is grown on the semiconductor substrate 200, an original silicon oxide layer on the semiconductor substrate 200 is generally be removed through Hydrofluoric Acid (HF) etching at first.

It may be understood that a thickness of the epitaxial layer 210 formed on the semiconductor substrate 200 may be adjusted according to a junction depth of an ultra-shallow junction 230 to be subsequently formed on the semiconductor substrate 200. For example, when a thin junction depth is required to be formed on the semiconductor substrate 200, a thick epitaxial layer 210 may be grown on the semiconductor substrate 200. When a thick junction depth is required to be formed on the semiconductor substrate 200, a thin epitaxial layer 210 may be grown on the semiconductor substrate 200.

In an implementation, the epitaxial layer 210 is made of the same material as the semiconductor substrate 200 For example, the epitaxial layer 210 and the semiconductor substrate 200 are both made of silicon. Since the epitaxially grown silicon matches well with the silicon of the semiconductor substrate 200, the crystalline phase of the silicon of the epitaxial layer 210 is consistent with that of the silicon of the semiconductor substrate 200, and there are few impurities, an implantation effect will not be affected in a subsequent dopant implantation process. In contrast, if the material of the epitaxial layer 210 matches poorly with that of the semiconductor substrate 200, the crystalline phase of the silicon of the epitaxial layer 210 is inconsistent with that of the silicon of the semiconductor substrate 200, doped ions will be trapped in a vacancy in a surface layer membrane of the epitaxial layer 210 during an implantation process, finally causing angular contamination of the implantation.

Figure 9:
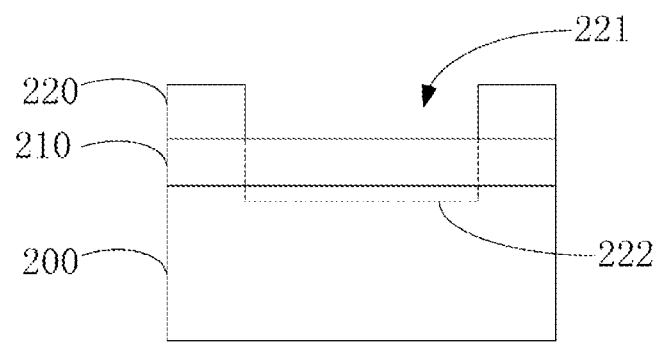
FIG. 9 illustrates a third cross-sectional diagram of a process phase in a method for forming an ultra-shallow junction according to another embodiment of the disclosure.

As shown in FIGS. 6 and 9, at S203, a photoresist layer 220 with a mask opening 221 is formed on the epitaxial layer 210. One part of the epitaxial layer 210 is covered by the photoresist layer 220, the other part of the epitaxial layer 210 is below the mask opening 221 of the photoresist layer 220, and the epitaxial layer 210 below the mask opening 221 and a part of the semiconductor substrate 200 form an implantation area 222 (an area marked by a dotted line in FIG. 9).

Figure 10:
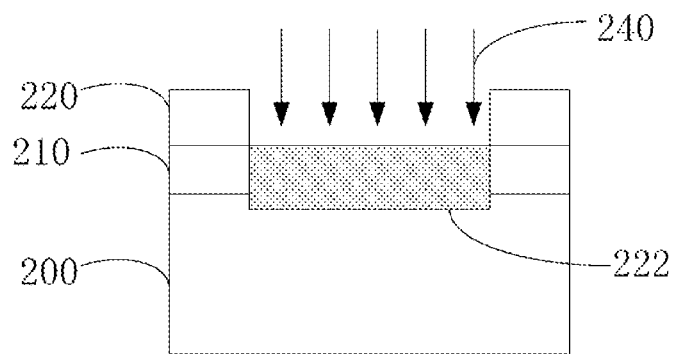
FIG. 10 illustrates a fourth cross-sectional diagram of a process phase in a method for forming an ultra-shallow junction according to another embodiment of the disclosure.

As shown in FIGS. 6 and 10, at S204, a first dopant 240 is provided, and the first dopant 240 is implanted into the implantation area 222, so that the first dopant 240 is implanted into an area not covered by the photoresist layer 220 in the epitaxial layer 210 below the mask opening 221 of the photoresist layer 220 and the part of the semiconductor substrate 200.

In an implementation, the first dopant 240 may include but not limited to boron, aluminum, gallium, indium, thallium, nitrogen, phosphorus, arsenic, antimony and bismuth.

In some implementations, for implanting the first dopant 240 into an area not covered by the photoresist layer 220 in the epitaxial layer 210 below the mask opening 221 of the photoresist layer 220 and the part of the semiconductor substrate 200, the first dopant 240 may be implanted by using an ion implantation process. In an implementation, the energy of the ion implantation process is more than 2 keV, and a dose of the ion implantation process is equal to or more than 1E13 $cm^{-2}$. The energy of the ion implantation process may be more than 5 keV, 8 keV, 10 keV, 12 keV, 14 keV, 16 keV, 18 keV, 20 keV and the like, and the dose of the ion implantation process may be 2E13 $cm^{-2}$, 5E13 $cm^{-2}$, 8E13 $cm^{-2}$, 1E14 $cm^{-2}$, 1E15 $cm^{-2}$, 5E15 $cm^{-2}$, 8E15 $cm^{-2}$ and the like.

In an implementation, a dose of the first dopant 240 implanted into the part of the semiconductor substrate 200 is less than 1E13 $cm^{-2}$, such as, 9E10 $cm^{-2}$, 1E11 $cm^{-2}$, 1E12 $cm^{-2}$, 2E12 $cm^{-2}$ or 5E12 $cm^{-2}$.

With the method for forming the ultra-shallow junction according to the embodiment of the disclosure, a low-energy (for example, 300 eV) and low-dose (for example, 2E12 $cm^{-2}$) implantation effect can be achieved by using a high-energy (such as, 10 keV) and high-dose (such as, 2E13 $cm^{-2}$) implantation condition.

Figure 11:
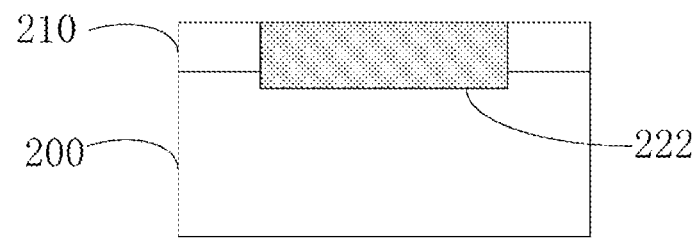
FIG. 11 illustrates a fifth cross-sectional diagram of a process phase in a method for forming an ultra-shallow junction according to another embodiment of the disclosure.

As shown in FIGS. 6 and 11, at S205, the photoresist layer 220 is removed.

In some implementations, photoresist layer 220 may be removed by using a dry or wet etching, or by using for example, a chemical-mechanical lapping process, a grinding process, a dry lapping process, a wet washing, one or more other suitable processes or any combination of the foregoing.

Figure 12:
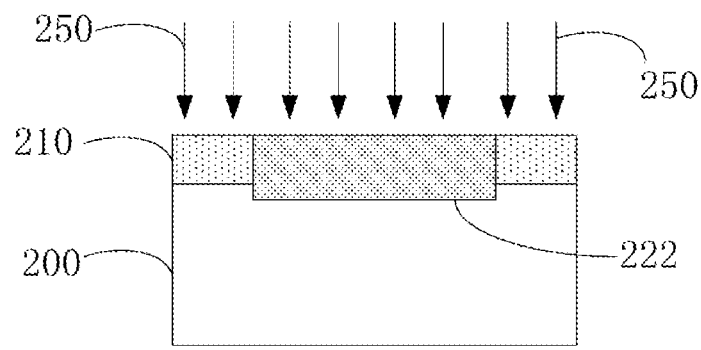
FIG. 12 illustrates a sixth cross-sectional diagram of a process phase in a method for forming an ultra-shallow junction according to another embodiment of the disclosure.

As shown in FIGS. 6 and 12, at S206, a second dopant 250 is provided, and the second dopant 250 is implanted into the epitaxial layer 210, to increase an etching selection ratio of the epitaxial layer 210.

In an implementation, the second dopant 250 may be germanium or silicon.

In an implementation, for the operation of implanting the second dopant 250 into the epitaxial layer 210, an ion implantation process may be used.

It may be understood that an implantation depth of the second dopant 250 does not exceed the thickness of the epitaxial layer 210. After the second dopant 250 is implanted into the epitaxial layer 210, the second dopant 250 destroys lattices in the epitaxial layer 210, so that the structure of the epitaxial layer 210 with implanted the second dopant 250 is converted into an amorphized structure, the etching selection ratio of which is significantly increased, facilitating removal of the epitaxial layer 210 by using an etching process later.

Figure 13:
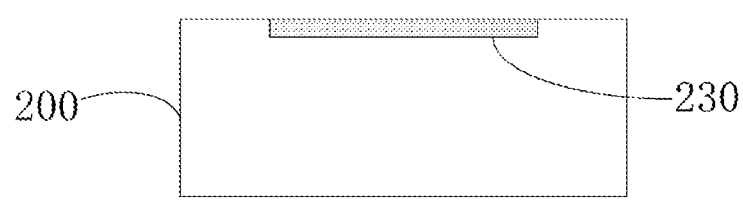
FIG. 13 illustrates a seventh cross-sectional diagram of a process phase in a method for forming an ultra-shallow junction according to another embodiment of the disclosure.

As shown in FIGS. 6 and 13, at S207, the epitaxial layer 210 is removed, to form an ultra-shallow junction 230 in the semiconductor substrate 200.

In an implementation, the epitaxial layer 210 may be removed by using a dry or wet etching, or also using for example, a chemical-mechanical lapping process, a grinding process, a dry lapping process, a wet washing, one or more other suitable technologies or any combination of the foregoing.

Although it is not shown in the drawings, it is understood that after the epitaxial layer 210 is removed, a thermal treatment operation is also included. Thermal treatment includes but not limited to low-temperature thermal annealing, rapid thermal annealing, instantaneous annealing, peak annealing or laser annealing.

It is understood that the method for forming the ultra-shallow junction according to the embodiment of the disclosure may be applied in a threshold voltage ion implantation area or a light doped structure implantation near a source/drain of a device as shown in FIG. 14. A semiconductor transistor shown in FIG. 14 includes a semiconductor substrate 100, a gate oxide layer 101 formed on the semiconductor substrate, a gate structure 102 formed on the gate oxide layer 101, a separation side wall 104 formed on side walls of the gate oxide layer 101 and the gate structure 102, as well as a doped structure 103 and a source-drain structure 105. An area A in FIG. 14 is an implantation area of a light doped structure, and configured to increase a threshold voltage of the device and effectively control a short-channel effect of the device, and an area B is a threshold voltage ion implantation area, and configured to adjust the threshold voltage.

In conclusion, the methods for forming the ultra-shallow junction according to embodiments of the disclosure have the following advantages and beneficial effects:

In the methods for forming the ultra-shallow junction according to the embodiments of the disclosure, a dose of the dopant implanted into the semiconductor substrate is controlled in a manner of forming an epitaxial layer on a semiconductor substrate, and removing the epitaxial layer after a dopant is implanted into the epitaxial layer and a part of the semiconductor substrate. A low-energy and low-dose implantation effect can be obtained through a high-energy and high-dose implantation process, and a problem that it is hard to obtain the low-energy and low-dose implantation effect in the related technology is solved.

In the embodiments of the disclosure, terms "first" and "second" are only used for the description purpose, and should not be construed as indicating or implying a relative importance. A term "a plurality of" refers to two or more than two, unless otherwise defined explicitly. Terms including "installation", "interconnection", "connection" and "fixation" are all construed in a broad sense, for example, "connection" may be fixed connection, and may also be removable connection, or integral connection. "interconnection" may be direct interconnection, and may also be indirect interconnection through an intermediate medium. For those of ordinary skills in the art, specific meanings of the above terms in the embodiments of the disclosure may be construed according to a specific situation.

In description of the embodiments of the disclosure, it is understood that terms including "upper", "lower", "left", "right", "front" and "rear" refer to an orientation or position relationship based on an orientation or position relationship shown in the drawings, are only for convenient description of the embodiments of the disclosure and simplifying description, does not indicate or imply that a referred apparatus or unit necessarily has a specific direction or constructed and operated in a specific orientation, and thus are not able to be construed as limitation on the embodiments of the disclosure.

In description of the specification, description with terms including "an embodiment", "some embodiments" and "a specific embodiment" means that specific features, structures, materials or characteristics described in combination with the embodiment or example are included in at least one embodiment or example of embodiments of the disclosure. In the specification, schematic expression of the above terms does not necessarily refer to the same embodiment or example. In addition, the described specific features, structures, materials or characteristics may be combined in a suitable manner in any one or more embodiments or examples.

The above are only preferred embodiments of the embodiments of the disclosure, and are not configured to limit the embodiments of the disclosure. For those skilled in the art, there may be various modifications and changes of the embodiments of the disclosure. Within the spirit and principle of the embodiments of the disclosure, any modifications, equivalent replacements, improvements and the like should be included in a protection scope of the embodiments of the disclosure.

What is claimed is:

1. A method for forming an ultra-shallow junction, comprising:
    providing a semiconductor substrate;
    forming an epitaxial layer on the semiconductor substrate;
    forming a photoresist layer with a mask opening on the epitaxial layer, wherein one part of the epitaxial layer is covered by the photoresist layer, the other part of the epitaxial layer is below the mask opening of the photoresist layer, and the epitaxial layer below the mask opening and a part of the semiconductor substrate form an implantation area;
    providing a first dopant and implanting the first dopant into the implantation area, so that the first dopant is implanted into the epitaxial layer below the mask opening and the part of the semiconductor substrate;
    removing the photoresist layer; and
    removing the epitaxial layer to form the ultra-shallow junction in the semiconductor substrate.

2. The method of claim 1, further comprising: after the photoresist layer is removed, and before the epitaxial layer is removed to form the ultra-shallow junction in the semiconductor substrate,
    providing a second dopant and implanting the second dopant into the epitaxial layer, to increase an etching selection ratio of the epitaxial layer.

3. The method of claim 2, wherein the second dopant is germanium or silicon.

4. The method of claim 2, wherein the operation of removing the epitaxial layer comprises:
    removing the epitaxial layer by using a wet or dry etching.

5. The method of claim 1, wherein the epitaxial layer is made of the same material as the semiconductor substrate.

6. The method of claim 1, wherein the operation of implanting the first dopant into the implantation comprises:
    implanting the first dopant by using an ion implantation process.

7. The method of claim 6, wherein an energy of the ion implantation process is more than 2 keV, and a dose of the ion implantation process is equal to or more than $1E13 cm^{-2}$.

8. The method of claim 7, wherein the energy of the ion implantation process is more than 10 keV, and the dose of the ion implantation process is more than $1E14 cm^{-2}$.

9. The method of claim 8, wherein the energy of the ion implantation process is more than 20 keV, and the dose of the ion implantation process is more than $1E15 cm^{-2}$.

10. The method of claim 1, wherein a dose of the first dopant implanted into the semiconductor substrate is less than $1E13 cm^{-2}$.

11. The method of claim 10, wherein the dose of the dopant implanted into the semiconductor substrate is less than $1E12 cm^{-2}$.

* * * * *